United States Patent [19]
Howell

[11] Patent Number: 5,012,205
[45] Date of Patent: Apr. 30, 1991

[54] BALANCED SPURIOUS FREE OSCILLATOR

[75] Inventor: William J. Howell, Chandler, Ariz.

[73] Assignee: Motorola, Inc., Schaumburg, Ill.

[21] Appl. No.: 547,258

[22] Filed: Jul. 2, 1990

[51] Int. Cl.$^5$ ............................................. H03L 7/00
[52] U.S. Cl. .................................. 331/117 R; 331/167
[58] Field of Search ........ 331/117 R, 117 FE, 108 R, 331/167

[56] References Cited
FOREIGN PATENT DOCUMENTS
0141206 6/1986 Japan ............................... 331/117 R Primary Examiner—Robert J. Pascal
Attorney, Agent, or Firm—Michael D. Bingham; Bradley J. Botsch

[57] ABSTRACT

A balanced oscillator circuit having first and second outputs includes a transistor circuit, having internal parasitic capacitors, for providing first and second output signals at the first and second outputs of the balanced oscillator circuit. An inductor circuit is coupled between the first and second outputs such that the inductor circuit and the internal parasitic capacitors determine the frequency of oscillation of the first and second output signals. The capacitance of the internal parasitic capacitors can be varied by an external voltage applied to the transistor circuit.

5 Claims, 1 Drawing Sheet

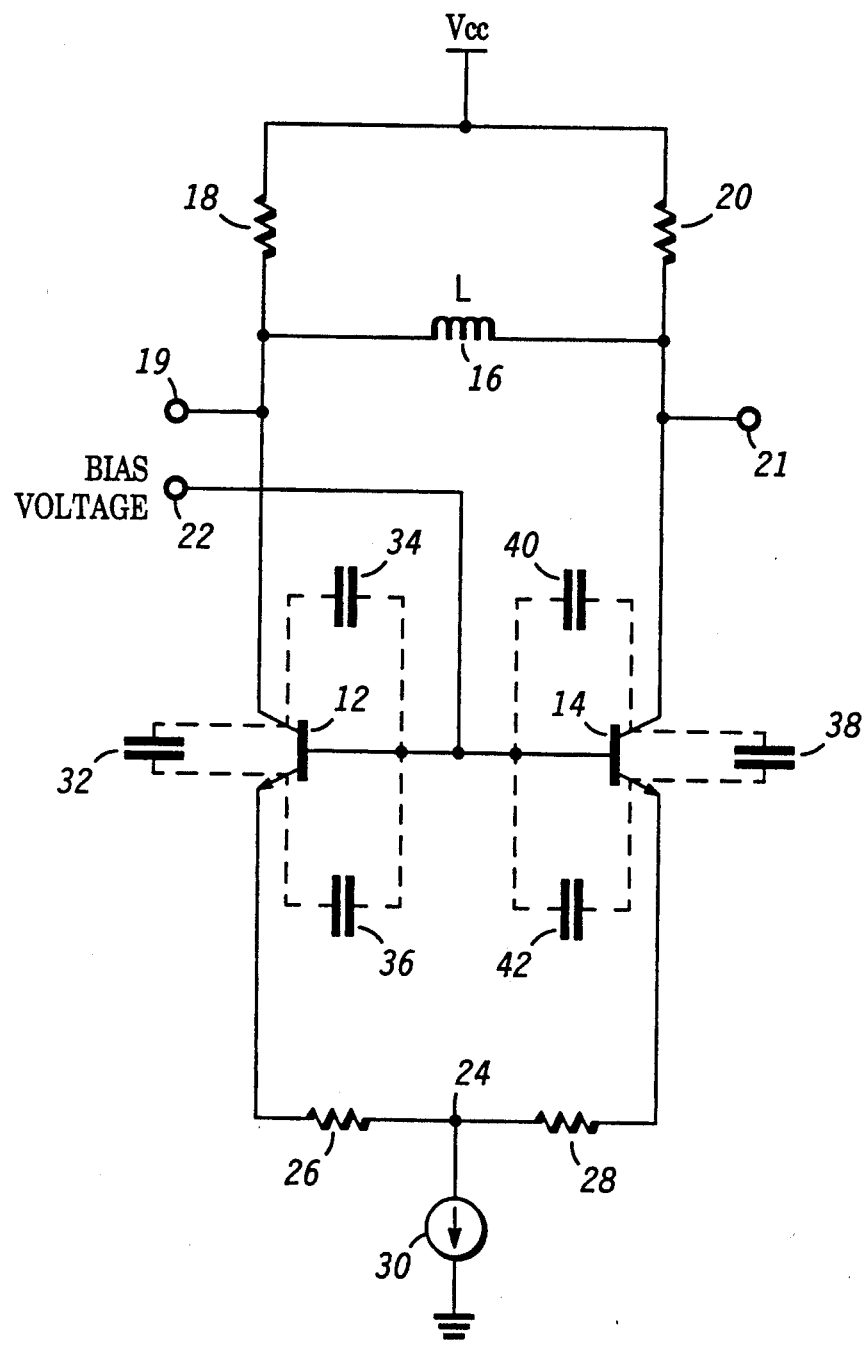

BALANCED SPURIOUS FREE OSCILLATOR

BACKGROUND OF THE INVENTION

This invention relates to oscillator circuits and, in particular, to balanced oscillator circuits having spurious free output signals.

Balanced oscillators have many applications and are widely used in the art. A typical balanced oscillators in a circuit that provides signals of a predetermined frequency at first and second outputs, whereby the output signal at the first output is substantially 180 degrees out of phase with respect to the output signal at the second output.

One type of a balanced oscillator circuit is a common emitter oscillator circuit which comprises first and second transistors the emitters of which are coupled together. Further, the base of the first transistor is coupled to the collector of the second transistor while the base of the second transistor is coupled to the collector of the first transistor. Also, a parallel inductive and capacitive tank circuit is coupled between the collectors of the first and second transistors. The common emitter oscillator circuit generates an output signal of predetermined frequency based upon the values of the external inductor and capacitors used in the tank circuit. However, due to the internal parasitic capacitors of the first and second transistors, the common emitter oscillator circuit typically produces undesired output signals at various frequencies wherein these undesired output signals are commonly referred to as "spurious" signals and exist in addition to the desired output signal of predetermined frequency.

Another type of balanced oscillator is a common collector oscillator circuit which comprises first and second transistors such that their collectors are coupled together. Further, an inductive-capacitive tank circuit is typically coupled between the base and emitter of the first transistor and the base and emitter of the second transistor. However, as with the common emitter oscillator circuit, the internal parasitic capacitors of the first and second transistors can generate undesired spurious signals.

Hence a need exists for a spurious free balanced oscillator circuit for providing an output signal of predetermined frequency.

SUMMARY OF THE INVENTION

Accordingly, it is an object of the present invention to provide an improved balanced oscillator circuit.

Another object of the present invention is to provide a spurious free balanced oscillator circuit.

Yet another object of the present invention is to provide a balanced oscillator circuit for operation at substantially high frequencies.

Still yet another object of the present invention is to provide a balanced oscillator having minimum external components.

In carrying out the above and other object of the present invention, there is provided a balanced oscillator circuit having first and second outputs comprising a common base configured transistor circuit for providing first and second output signals at the first and second outputs of the balanced oscillator circuit, the transistor circuit having parasitic capacitances associated therewith; and an inductive circuit coupled between the first and second outputs, the inductive circuit and the parasitic capacitances determining the frequency of oscillation of the first and second output signals.

The above and other object, features and advantages of the present invention will be better understood from the following detailed description taken in conjunction with the accompanying drawing.

BRIEF DESCRIPTION OF THE DRAWING

The sole FIGURE is a detailed schematic diagram illustrating the balance oscillator circuit of the present invention.

DETAILED DESCRIPTION OF THE INVENTION

Referring to the sole FIGURE, a detailed schematic diagram illustrating the balance oscillator circuit 10 of the present invention is shown comprising transistor 12 having a collector coupled to the collector of transistor 14 by inductive element 16. The collector of transistor 12 is further coupled both to output terminal 19 and through resistor 18 to a first supply voltage terminal at which the operating potential $V_{CC}$ is applied. The collector of transistor 14 is coupled both to output terminal 21 and to operating potential $V_{CC}$ through resistor 20. The base of transistor 12 is coupled to the base of transistor 14 and to terminal 22. The emitter of transistor 12 is coupled to node 24 through resistor 26 while the emitter of transistor 14 is coupled to node 24 through resistor 28. Node 24 is returned to ground reference through current source 30.

Also, inherent to or associated with transistor 12 are internal parasitic capacitances 32, 34 and 36 (shown in dotted lines) whereby capacitance 32 is the collector-emitter capacitance of transistor 12, capacitance 34 is the collector-base capacitance of transistor 12, and capacitance 36 is the base-emitter capacitance of transistor 12. Likewise, transistor 14 has internal parasitic capacitances 38, 40 and 42 (also shown in dotted lines) whereby capacitance 38 is the collector-emitter capacitance of transistor 14, capacitance 40 is the collector-base capacitance of transistor 14, and capacitance 40 is the base-emitter capacitance of transistor 14. It must be realized that these six capacitors are not lumped elements but are inherent internal parasitic capacitors that are associated with transistors 12 and 14.

In operation, balanced oscillator circuit 10 is configured as a common base balanced oscillator which provides output signals of predetermined frequency at output terminals 19 and 21 whereby the output signal at output terminal 19 is substantially 180 degrees out of phase with the output signal at output terminal 12. It is important to realize that the base of transistors 12 and 14 are at virtual ground since the current flowing through the emitter of transistor 12 is substantially equal and opposite to the current flowing through the emitter of transistor 14. Further, the positive feedback, which is essential to oscillator circuits, is accomplished by feeding back some of the energy in the output signals at output terminals 19 and 21 to the emitters of transistors 12 and 14 via internal capacitances 32 and 38 of transistors 12 and 14, respectively. The frequency of oscillation is determined by the values of inductive element 16 and the equivalent capacitance ($C_{equiv}$) of capacitances 32, 34, 36, 38, 40 and 42. The equivalent capacitance can readily be calculated as:

$$C_{equiv} = [C_{34} + (C_{32} \| C_{36})] + [C_{40} + (C_{38} \| C_{42})] \tag{1}$$

where || represents "in parallel with".

Therefore, the frequency of oscillation ($F_O$) can be readily calculated as:

$$F_O = 2 \times Pi \times (L \times C_{equiv})^{-\frac{1}{2}} \qquad (2)$$

where
Pi = 3.1415927;
L is the inductance of inductive element 16; and
$C_{equiv}$ is the equivalent capacitance value calculated in Eqn. 1.

It is important to realize that since the internal parasitic capacitances are utilized to generate the frequency of oscillation, there are substantially no parasitic capacitances available to generate any spurious oscillations at other undesired frequencies. Therefore, balance oscillator circuit 10 generates signals only at the desired frequency of oscillation and not at any spurious undesired frequencies. Further, balanced oscillator circuit 10 can operate at substantially higher frequencies than other balanced oscillator circuits since the gain of common base configuration circuits is typically maintained at higher frequencies.

The frequency of oscillation can be adjusted to various predetermined frequencies by simply adjusting the value of single external inductive element 16. One way of accomplishing this is by adding a varactor in series with inductive element 16 so that as a tuning voltage of the varactor is varied, the equivalent inductance of the series inductive element and varactor is varied. Further, the frequency of oscillation can also be adjusted by varying the bias voltage applied to input terminal 22. When the voltage applied at input terminal 22 is varied, the bias voltage applied to the bases of transistors 12 and 14 is varied which results in varying the capacitance of internal parasitic capacitances or capacitors 34 and 40. This will vary the value of the equivalent capacitance ($C_{equiv}$) of Eqn. 1 and, thus, the frequency of oscillation ($F_O$) of Eqn. 2. Therefore, balanced oscillator circuit 10 functions as a variable frequency oscillator (VFO) whereby varying the value of inductor 16 will vary the frequency of oscillation. In addition, balanced oscillator circuit 10 functions as a voltage controlled oscillator (VCO) whereby varying the voltage at input terminal 22 will vary the frequency of oscillation.

It should be noted that a set of outputs for balance oscillator circuit 10 could be provided from the emitters of transistor 12 and 14 if so desired. However, the signals at the emitters thereof would typically be less amplitude than the signals at output terminals 19 and 21, but the emitters would provide a lower output impedance. Furthermore, the voltage swings at the emitters of transistors 12 and 14 can be adjusted by adjusting the values of resistors 26 and 28.

It should also be noted that resistors 18 and 20 can be eliminated from the circuit if the center of inductor 16 is directly coupled to operation potential $V_{CC}$.

Although, the balanced oscillator circuit of the present invention has been described in detail using bipolar transistors, it should be understood that the present invention is not limited to the particular forms shown and it is intended in the appended claims to cover all modifications that do not depart from the scope of this invention. One obvious modification would be the use of field-effect transistors in place of bipolar transistors 12 and 14.

By now it should be appreciated that there has been provided a balanced oscillator circuit for providing spurious free output signals of predetermined frequency.

What is claimed is:

1. A balanced oscillator circuit having first and second outputs, comprising:
    transistor circuit means for providing first and second output signals at the first and second outputs, said transistor circuit means including;
        a first transistor having a collector, a base, and an emitter, said collector being coupled to a first supply voltage terminal and to the first output said base being coupled to an input terminal to which a bias potential is applied, and said emitter being coupled to a first node;
        a second transistor having a collector, a base and an emitter, said collector being coupled to said first supply voltage terminal and to the second output, said base being coupled to said base of said first transistor of said transistor circuit means, and said emitter being coupled to said first node, said first and second transistors having parasitic capacitances associated therewith;
    a current source coupled between said first node and a second supply voltage terminal: and
    inductive means coupled between the first and second outputs, said inductive means and said parasitic capacitances determining the frequency of oscillation of said first and second output signals wherein said parasitic capacitances associated with said first and second transistors are varied in value in response to said bias potential thereby varying said frequency of oscillation of said first and second output signals.

2. The balanced oscillator circuit according to claim 1 wherein said transistor circuit means further includes:
    a first resistor coupled between said emitter of said first transistor of said transistor circuit means and said first node;
    a second resistor coupled between said emitter of said second transistor of said transistor circuit means and said first node;
    a third resistor coupled between the first output and said first supply voltage terminal; and
    a fourth resistor coupled between the second output and said first supply voltage terminal.

3. A circuit having first and second outputs, comprising:
    a first transistor having a collector, a base and an emitter, said collector being coupled a first supply voltage terminal and to the first output for providing a first signal thereto, said base being coupled to an input terminal, and said emitter being coupled to a first node;
    a second transistor having a collector, a base and an emitter, said collector being coupled to said first supply voltage terminal and to the second output for providing a second signal thereto, said base being coupled to said base of said first transistor, and said emitter being coupled to said first node;
    an inductor coupled between said collector of said first and second transistors;
    a current source coupled between said first node and a second supply voltage terminal;
    a first resistor coupled between said emitter of said first transistor and said first node; and
    a second resistor coupled between said emitter of said second transistor and said first node.

4. The circuit according to claim 3 further includes:

a third resistor coupled between said collector of said first transistor and said first supply voltage terminal; and a fourth resistor coupled between said collector of said second transistor and said first supply voltage terminal.

5. The circuit according to claim 4 wherein said first and second signals oscillate at a predetermined frequency which is a function of the value of said inductor and a voltage applied to said input terminal.

* * * * *